(12) United States Patent
Konishi et al.

(10) Patent No.: US 11,067,624 B2
(45) Date of Patent: Jul. 20, 2021

(54) INSPECTION SYSTEM

(71) Applicant: Tokyo Electron Limited, Tokyo (JP)

(72) Inventors: Kentaro Konishi, Yamanashi (JP); Hiroki Shikagawa, Yamanashi (JP); Jun Fujihara, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 2 days.

(21) Appl. No.: 16/630,606

(22) PCT Filed: May 11, 2018

(86) PCT No.: PCT/JP2018/018314
§ 371 (c)(1),
(2) Date: Jan. 13, 2020

(87) PCT Pub. No.: WO2019/017050
PCT Pub. Date: Jan. 24, 2019

(65) Prior Publication Data
US 2020/0158775 A1  May 21, 2020

(30) Foreign Application Priority Data
Jul. 19, 2017  (JP) .............................. JP2017-139936

(51) Int. Cl.
*G01R 31/28* (2006.01)
*H01L 21/67* (2006.01)
(Continued)

(52) U.S. Cl.
CPC ........ *G01R 31/2831* (2013.01); *G01J 5/0007* (2013.01); *G01R 1/06794* (2013.01);
(Continued)

(58) Field of Classification Search
CPC ............ G01R 31/2831; G01R 1/06794; G01R 1/07342; G01R 31/2893; G01R 31/2891;
(Continued)

(56) References Cited

U.S. PATENT DOCUMENTS

2012/0086142 A1* 4/2012 Terada .............. H01L 21/67745
264/39

FOREIGN PATENT DOCUMENTS

JP  63-229836 A  9/1988
JP  H03-289152 A  12/1991
(Continued)

OTHER PUBLICATIONS

International Search Report dated Jul. 31, 2018 for WO 2019/017050 A1.

*Primary Examiner* — Melissa J Koval
*Assistant Examiner* — Trung Q Nguyen
(74) *Attorney, Agent, or Firm* — Abelman, Frayne & Schwab

(57) ABSTRACT

An inspection system includes: an inspection section provided with an inspection part having a plurality of inspection units each including a tester that performs an electrical inspection of an inspection target, and a probe card provided between the tester and the inspection target; and a loader section including an arrangement part in which a storage container for the inspection target is disposed, and a loader that delivers the inspection target between the storage container and the inspection section. The inspection part includes a plurality of inspection unit rows that are formed by arranging the plurality of inspection units in one horizontal direction and arranged in a plurality of tiers in a vertical direction. The arrangement part is provided on an end part side in one direction of the inspection part.

17 Claims, 10 Drawing Sheets

(51) Int. Cl.
*G01J 5/00* (2006.01)
*G01R 1/067* (2006.01)
*G01R 1/073* (2006.01)
*H01L 21/68* (2006.01)

(52) U.S. Cl.
CPC .... *G01R 1/07342* (2013.01); *H01L 21/67242* (2013.01); *H01L 21/68* (2013.01); *G01J 2005/0081* (2013.01)

(58) Field of Classification Search
CPC ............... G01R 1/0491; G01J 5/0007; G01J 2005/0081; H01L 21/67242; H01L 21/68; G01N 33/12; G01B 11/2531
USPC .... 324/500, 750.23, 756.01–758.01, 762.02, 324/76.11, 106, 754.01–754.07, 690, 696, 324/715, 724
See application file for complete search history.

(56) References Cited

FOREIGN PATENT DOCUMENTS

| | | | | | |
|---|---|---|---|---|---|
| JP | WO2010/092672 | * | 2/2009 | ............ | G01R 31/00 |
| JP | 2016-046285 A | | 4/2016 | | |
| JP | 2016-162803 A | | 9/2016 | | |
| KR | 10-0892756 B1 | | 4/2009 | | |
| KR | 10-2010-0089107 A | | 8/2010 | | |
| WO | 2009/004968 A | | 1/2009 | | |

* cited by examiner

INSPECTION SYSTEM

CROSS REFERENCE TO RELATED APPLICATIONS

This application is a national phase of PCT application No. PCT/JP2018/018314, filed on 11 May 2018, which claims priority from Japanese patent application No. 2017-139936, filed on 19 Jul. 2017, all of which are incorporated herein by reference.

TECHNICAL FIELD

The present invention relates to an inspection system that inspects a substrate.

BACKGROUND

In a semiconductor device manufacturing process, an electrical inspection of a plurality of semiconductor elements (devices) formed on a semiconductor wafer serving as a substrate (hereinafter, simply referred to as a wafer) is performed at the stage where all processes on the wafer are completed. An inspection apparatus that performs such an electrical inspection generally includes a wafer stage (chuck top), a probe card, and a tester. The probe card has a plurality of probes that contact a plurality of devices formed on the wafer. The tester gives electrical signals to the plurality of devices formed on the wafer via the probe card to inspect various electrical characteristics of the device.

In addition, in order to efficiently perform such an electrical inspection on a large number of wafers, an inspection apparatus in which a plurality of inspection units including a wafer stage, a probe card, and a tester are arranged in the vertical direction and the horizontal direction (inspection system) is used (see, e.g., Patent Document 1).

In the technique of Patent Document 1, a loading/unloading section (loader section) having a storage container (FOUP) that stores a plurality of wafers is provided to face an inspection section in which a plurality of such inspection units is arranged in the vertical direction and the horizontal direction. In addition, a common transfer robot is provided for all the cells between the inspection section and the loader section to transfer the wafers, and a common aligner (moving stage) is provided in each tier for a plurality of cells in the horizontal direction to align the wafers. Further, an alignment camera capable of moving in the arrangement direction of a plurality of cells in the horizontal direction is provided in each tier.

PRIOR ART DOCUMENT

Patent Document

Patent Document 1: Japanese Patent Laid-Open Publication No. 2016-046285

SUMMARY OF THE INVENTION

Problems to be Solved

The present disclosure provides a technique capable of reducing a footprint per inspection unit in an inspection system in which a plurality of inspection units are arranged in the vertical direction and the horizontal direction.

Means to Solve the Problems

An inspection unit according to an embodiment of the present disclosure includes: an inspection section provided with an inspection part having a plurality of inspection units each including a tester configured to perform an electrical inspection of an inspection target and a probe card provided between the tester and the inspection target; and a loader section that includes an arrangement part in which a storage container for the inspection target is disposed, and a loader configured to deliver the inspection target between the storage container and the inspection section. The inspection part includes a plurality of inspection unit rows that are formed by arranging the plurality of inspection units in one horizontal direction and arranged in a plurality of tiers in the vertical direction. The arrangement part is provided on an end part side of the inspection part in the one horizontal direction. The inspection section is provided adjacent to each tier of the inspection unit rows of the inspection part, and further includes a plurality of transfer paths extending in the one horizontal direction and a plurality of transfer mechanisms each including a transfer arm provided so as to be movable along the respective transfer paths configured to transfer the inspection target loaded from the loader to and from the inspection unit.

Effect of the Invention

The present disclosure provides a technique capable of reducing a footprint per inspection unit in an inspection system in which a plurality of inspection units are arranged in the vertical direction and the horizontal direction.

DETAILED DESCRIPTION TO EXECUTE THE INVENTION

Hereinafter, various embodiments of the present disclosure will be described in detail with reference to the drawings.

First Embodiment

A first embodiment will be described first.

Figure 1:
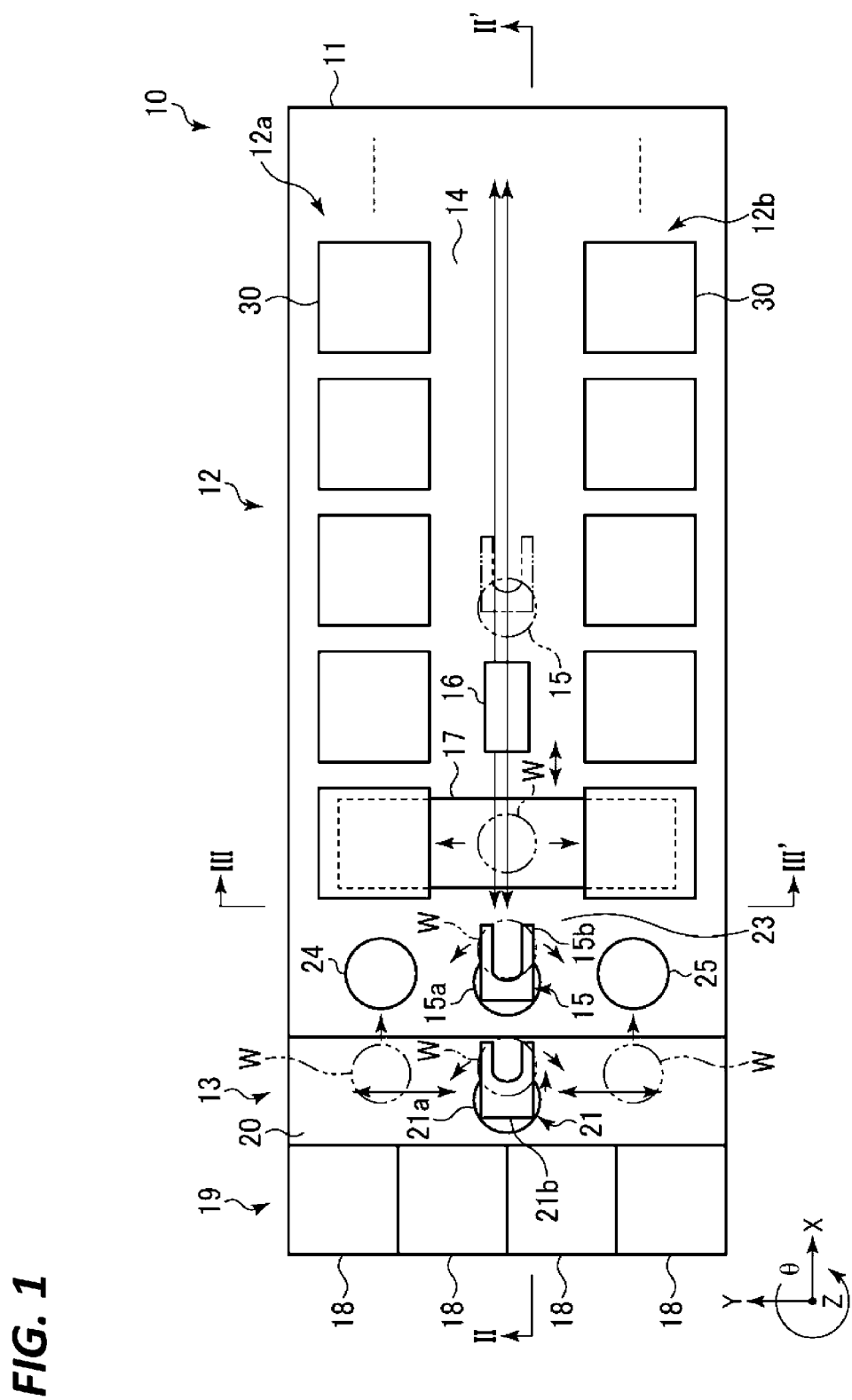
FIG. 1 is a plan view illustrating a schematic configuration of an inspection system according to a first embodiment.
Figure 2:
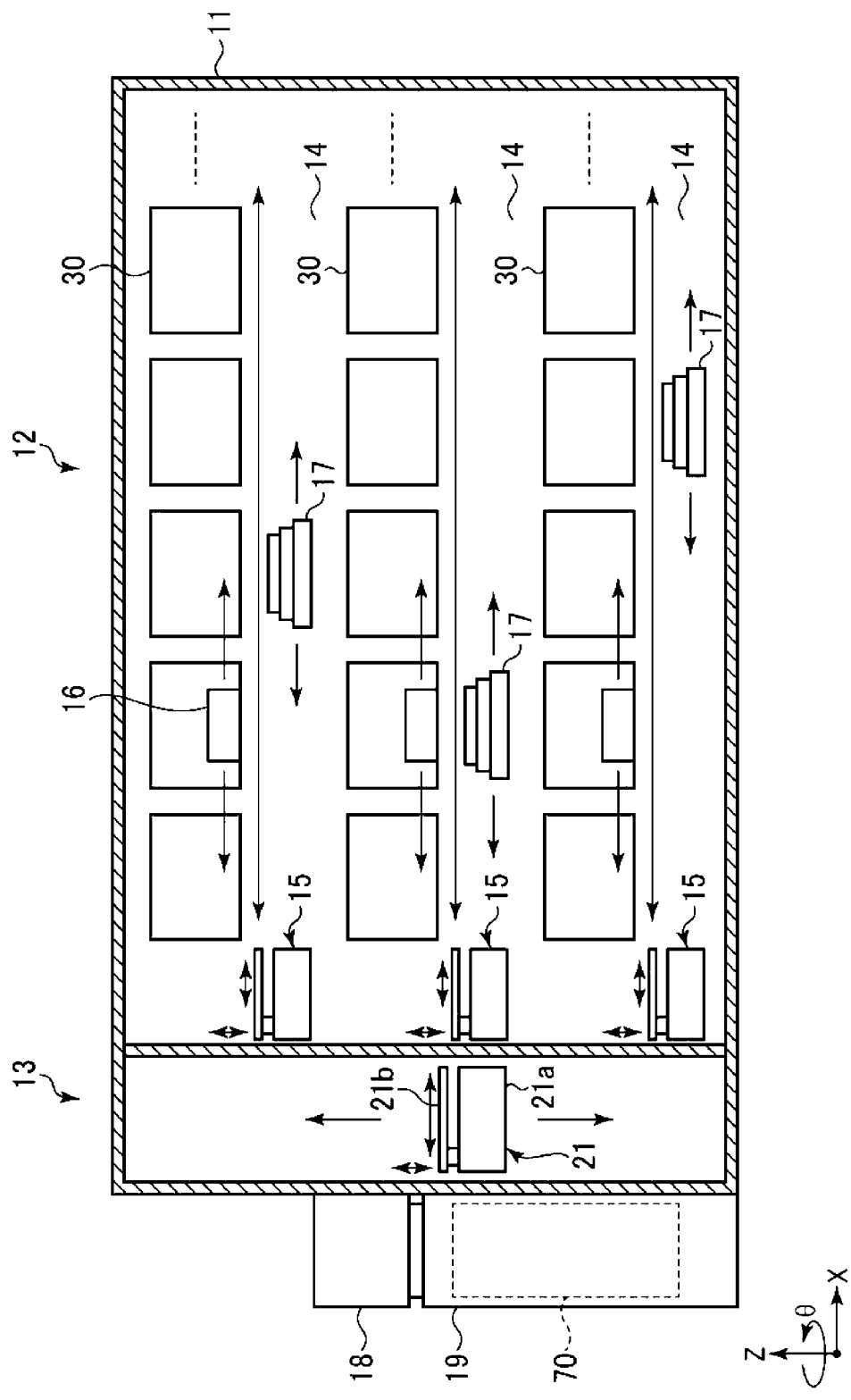
FIG. 2 is a cross-sectional view taken along line II-II' of the inspection system of FIG. 1.
Figure 3:
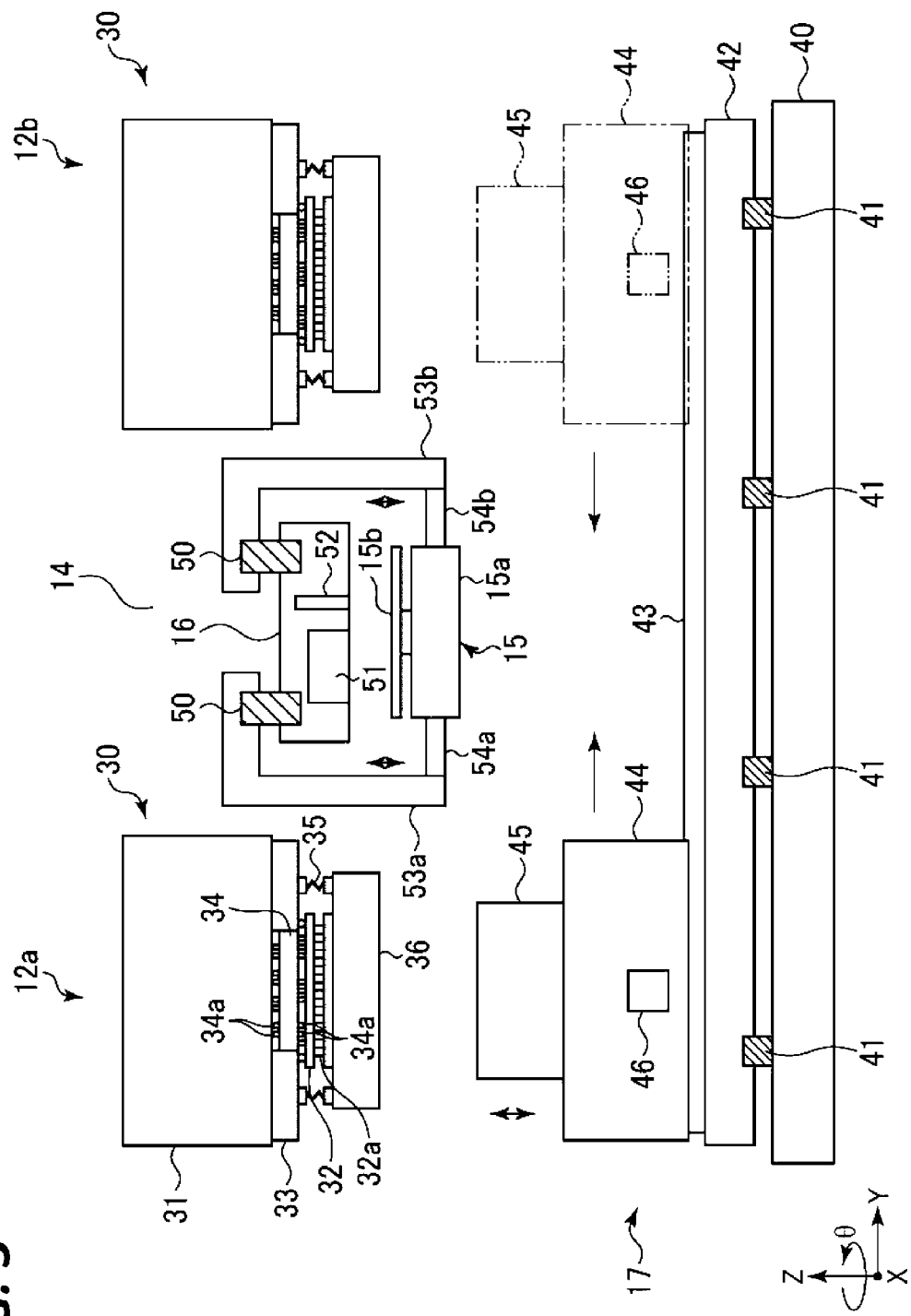
FIG. 3 is a cross-sectional view taken along line III-III' of the inspection system of FIG. 1.

FIG. 1 is a plan view illustrating a schematic configuration of the inspection system according to the first embodiment, FIG. 2 is a cross-sectional view taken along line II-II' of the inspection system of FIG. 1, and FIG. 3 is a cross-sectional view taken along line III-III' of the inspection system of FIG. 1.

The inspection system 10 according to the first embodiment inspects electrical characteristics of a plurality of devices formed on a wafer that is an inspection target.

The inspection system 10 includes a housing 11. The housing 11 includes an inspection section 12 that inspects electrical characteristics of a device formed on the wafer W and a loader section that loads/unloads the wafer W into/from the inspection section 12.

The inspection section 12 includes a first inspection part 12a and a second inspection part 12b. In the first inspection part 12a, inspection unit rows in which a plurality of (in the drawing, five or more) inspection units 30 are arranged along the X direction in the drawing are arranged in three tiers in the Z direction (vertical direction). The second inspection part 12b is provided to face the first inspection part 12a, and similarly to the first inspection part 12a, the inspection unit rows in which a plurality of inspection units 30 are arranged along the X direction are arranged in three tiers in the Z direction.

Between the first inspection part 12a and the second inspection part 12b, three transfer paths 14 extending along the X direction are formed corresponding to the respective tiers of the plurality of inspection unit rows, and each of these transfer paths 14 is provided with a transfer mechanism 15 that may move in the X direction. The transfer mechanism 15 includes a base 15a and a transfer arm 15b provided on the base 15a, and the transfer arm 15b is configured to move back and forth, move up and down, and rotate. Further, each transfer path 14 is similarly provided with a camera unit 16 including an alignment camera that may move in the X direction.

In addition, to correspond to the respective tiers of the first inspection part 12a and the second inspection part 12b, three aligners 17 are provided to align the wafers W in the inspection units 30 of the first inspection part 12a and the second inspection part 12b in each tier.

The loader section 13 is connected to one end part in the longitudinal direction of the inspection section 12, places a FOUP 18, which is a container that accommodates a plurality of wafers W, and includes a mounting table 19 having a load port and a transfer chamber 20 provided with a loader 21 that transfers the wafer W. A controller 70 and the like are accommodated inside the mounting table 19. A plurality of (four in the figure) FOUPs 18 are placed on the mounting table 19 along the Y direction orthogonal to the X direction, which is an arrangement direction of the inspection units 30. The transfer chamber 20 has the same length in the height direction (Z direction) and the width direction (Y direction) as the inspection section 12, and the loader 21 is configured to be movable in the transfer chamber 20 in the Y direction and the Z direction. The loader 21 has a base 21a and a transfer arm 21b provided thereon, and the transfer arm 21b is configured to move back and forth, move up and down, and rotate.

Each transfer mechanism 15 of the inspection section 12 has a home position 23 at the end part of the transfer path 14 on the transfer chamber 20 side. A pre-alignment unit 24 is provided on one side of the home position 23 to perform a pre-alignment of the wafer W, and a buffer unit 25 is provided on the other side thereof to temporarily place the wafer W. The buffer unit 25 has a plurality of wafer placement units.

The loader 21 in the transfer chamber 20 is configured to take out the wafer W from one of the FOUPs 18 and transfer the wafer W to one of the wafer placement units in the buffer unit 25 in each tier of the inspection section 12 or the pre-alignment unit 24 in each tier. The transfer mechanism 15 at each tier receives the wafer W pre-aligned by the pre-alignment unit 24 or the wafer W temporarily placed in the buffer unit 25 after the pre-alignment, travels on the transfer path 14, and transfers the wafer W to any of the inspection units 30. Further, the wafer W after inspection in one of the inspection units 30 at each tier is placed on one of the wafer placement units of the buffer unit 25 from the transfer mechanism 15, received by the loader 21, and returned to the FOUP 18.

As illustrated in FIG. 3, the inspection unit 30 includes a tester 31, a probe card 32, a support plate 33, a contact block 34, a bellows 35, and a chuck top (stage) 36. The tester 31 sends inspection signals to a plurality of devices formed on the wafer W. The probe card 32 has a plurality of probes 32a that are in contact with electrodes of a plurality of devices formed on the wafer W. The support plate 33 is provided under the tester 31 and supports the probe card 32. The contact block 34 connects the support plate 33, the tester 31, and the probe card 32, and a plurality of pogo pins 34a are provided on the upper and lower surfaces of the contact block 34 to electrically connect the probe card 32 and the tester 31. The bellows 35 is provided so as to hang down from the support plate 33 and surround the probe card 32. The bellows 35 is for forming a sealed space including the probe card 32 and the wafer W in a state where the wafer W on the chuck top 36 is in contact with the plurality of probes 32a of the probe card 32. By evacuating the sealed space, the chuck top 36 is adsorbed toward the support plate 33.

The aligner 17 of each tier includes an X block 42, a Y block 44, and a Z block 45. The X block 42 extends from the first inspection part 12a to the second inspection part 12b on the base plate 40 at that tier, and moves in the X direction on four guide rails provided on the base plate 40 along the X direction. The Y block 44 moves in the Y direction on a guide rail 43 provided on the X block 42 along the Y direction. The Z block 45 moves in the Z direction with respect to the Y block 44. The chuck top 36 is engaged on the Z block 45 in a state where a predetermined positional relationship is maintained. The X block 42 is movable from the inspection unit 30 closest to the loader section 13 to the inspection unit 30 farthest therefrom. The Y block 44 is movable across the transfer path 14 from the inspection unit 30 of the first inspection part 12a to the inspection unit 30 of the second inspection part 12b. Meanwhile, a lower camera 46 is provided on the peripheral wall of the Y block 44 to photograph the lower surface of the probe card 32.

The aligner 17 is used when aligning the wafer W in the inspection unit 30, attaching the chuck top 36 to the probe card 32, and removing the chuck top 36 from the probe card 32.

Figure 4:
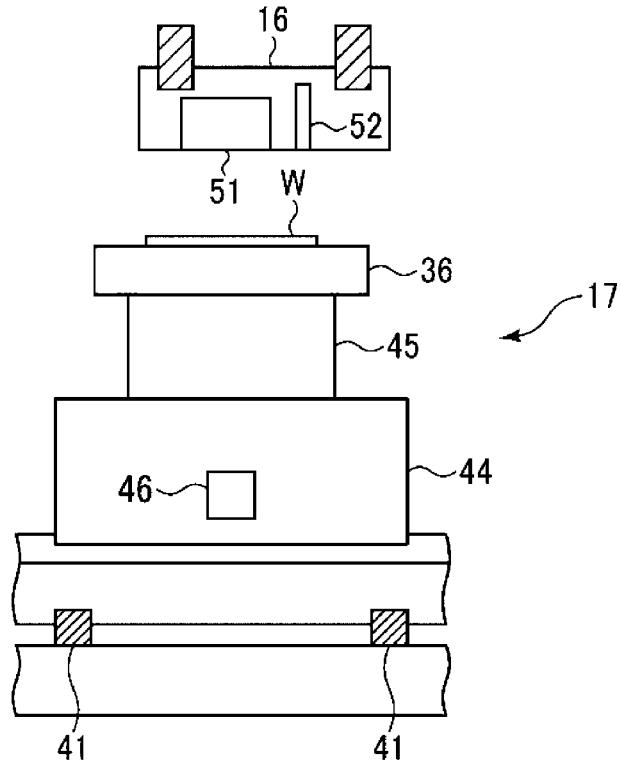
FIG. 4 is a view for explaining a use state of an alignment camera of a camera unit in the inspection system of FIG. 1.
Figure 5:
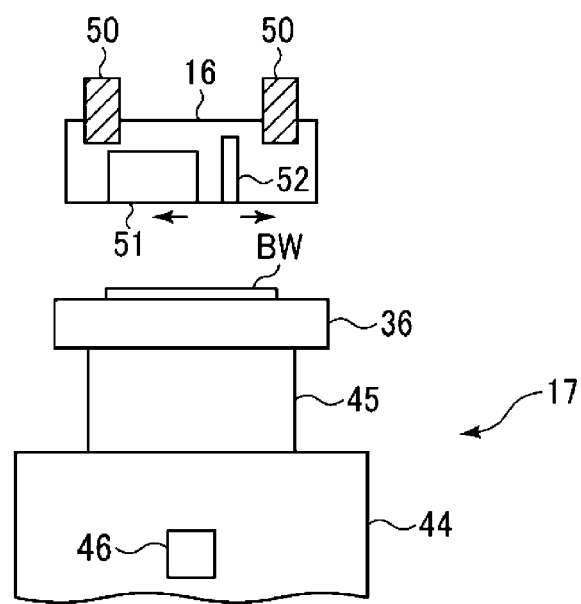
FIG. 5 is a view for explaining a use state of a radiation thermometer of a camera unit in the inspection system of FIG. 1.

Two guide rails 50 are provided along the X direction in the upper portion of the transfer path 14, and the camera unit 16 is configured to move along the guide rails 50. The camera unit 16 includes an alignment camera 51 and a radiation thermometer 52. As illustrated in FIG. 4, the alignment camera 51 photographs a state where the wafer W is placed on the chuck top 36 mounted on the aligner 17. At this time, the position of the chuck top 36 is adjusted by the aligner 17. Further, as illustrated in FIG. 5, the radiation thermometer 52 transfers a black wafer BW instead of the wafer W and performs an alignment operation, thereby measuring the temperature of the black wafer BW at each alignment location. That is, the temperature may be measured at a plurality of positions of the black wafer BW by adjusting the position of the chuck top 36 by the aligner 17.

Further, the guide rail 50 also supports the transfer mechanism 15, and the transfer mechanism 15 is configured to be movable along the guide rail 50 in the transfer path 14 in the X direction. Sliders 53a and 53b formed in a Γ shape and an inverse Γ shape are movably engaged with the upper portions of the two guide rails 50, respectively. The base 15a of the transfer mechanism 15 is supported by the vertical portions of the sliders 53a and 53b via support members 54a and 54b so as to be lifted and lowered. Thus, the transfer mechanism 15 is configured to be movable in the X direction and the Z direction. The transfer mechanism 15 normally moves only in the X direction, but is retracted upward in the Z direction when there is a possibility that the transfer mechanism 15 and the chuck top 36 on the aligner 17 may interfere with each other during transfer of the wafer W.

Figure 6:
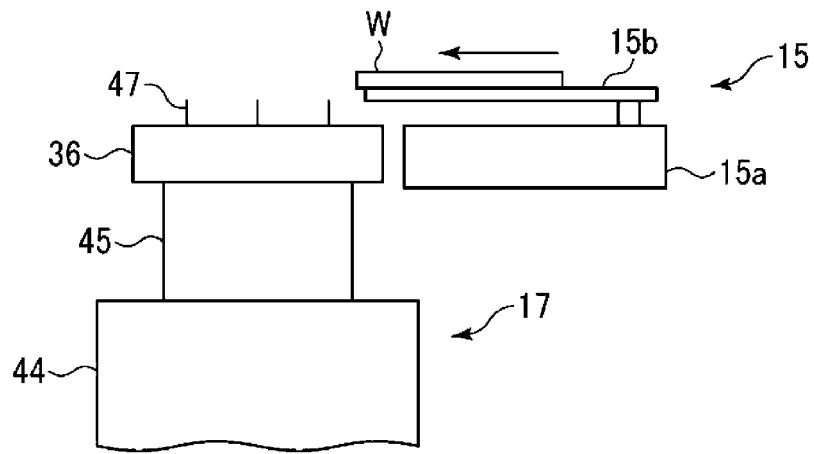
FIG. 6 is a view for explaining a state in a case where wafers are transferred between a transfer mechanism and a chuck top in the inspection system of FIG. 1.

Transfer of the wafer W between the transfer mechanism 15 and the chuck top 36 is performed as illustrated in FIG. 6. That is, the wafer W placed on the transfer arm 15b of the transfer mechanism 15 is transferred onto lift pins 47 in a state where the lift pins 47 protrude from the chuck top 36 by a mechanism mounted on the aligner 17. Alternatively, the wafer W on the lift pins 47 is received by the transfer arm 15b.

Figure 7:
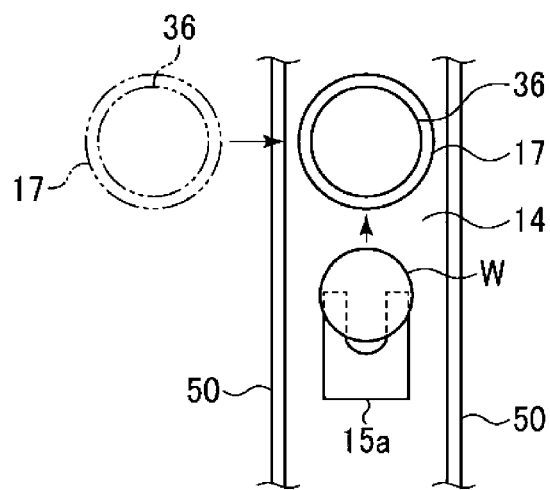
FIG. 7 is a view illustrating an example of a technique in a case where wafers are transferred between a transfer mechanism and a chuck top in the inspection system of FIG. 1.
Figure 8:
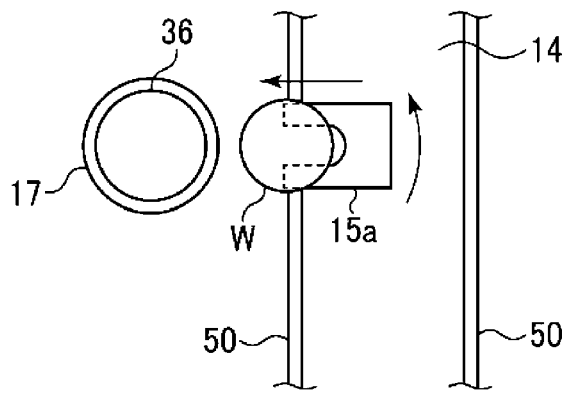
FIG. 8 is a view illustrating another example of a technique in a case where wafers are transferred between a transfer mechanism and a chuck top in the inspection system of FIG. 1.

Transfer of the wafer W between the transfer arm 15b of the transfer mechanism 15 and the chuck top 36 may be performed as illustrated in FIG. 7 or 8. In the example of FIG. 7, the transfer of the wafer W is performed in a state where the aligner 17 is moved to the transfer path 14. In the example of FIG. 8, the transfer of the wafer W is performed in a state where the transfer arm 15a is moved toward the chuck top 36 on the aligner 17 while the aligner 17 is positioned below the tester 31.

Meanwhile, in the first embodiment, two guide rails 50 are provided on the upper portion of the transfer path 14 so that the camera unit 16 and the transfer mechanism 15 travel along the X direction while being supported by the guide rails 50. However, one of the elements or both may be supported by a guide rail 41 that causes the X block 42 of the aligner 17 to travel along the X direction and travel in the X direction.

The controller 70 basically includes a computer, and controls respective components of the inspection system 10 and includes a main controller having a CPU, an input device (such as a keyboard and a mouse), an output device (such as a printer), a display device (such as a display), and a storage device (storage medium). Examples of the respective components include a tester 31, a vacuum adsorption mechanism, an aligner 17, a transfer mechanism 15, and a loader 21 of each inspection unit 30. The main controller of the controller 70 causes the inspection system 10 to execute a predetermined operation based on, for example, a processing recipe stored in a storage medium built in the storage device or a storage medium set in the storage device.

Next, the operation of the inspection system 10 configured as described above will be described with reference to FIGS. 9A to 9D and 10A to 10D. FIGS. 9A to 9D are views for explaining an operation of transferring a wafer W onto a chuck top 36 of an inspection unit 30 having no wafer and bringing the wafer W on the chuck top 36 into contact with a probe card 32 by an aligner 17 to bring the wafer into an inspection state in the inspection system 10 of FIG. 1. FIGS. 10A to 10D are views for explaining an operation of removing the chuck top 36 and unloading the wafer W on the chuck top 36 in the inspection unit 30 after the inspection is completed in the inspection system 10 of FIG. 1.

First, the wafer W before inspection is taken out from the FOUP 18 by the loader 21 and transferred to the pre-alignment unit 24 or the buffer unit 25, and a pre-alignment is performed by the pre-alignment unit 24. The wafer W in the pre-alignment unit 24 or the buffer unit 25 is transferred to the inspection unit 30 to be transferred by the transfer mechanism 15 and placed on the chuck top 36 on the aligner 17 (see, e.g., FIG. 9A). At this time, the wafer W is photographed by the alignment camera 51 of the camera unit 16 while the aligner 17 is moved. Meanwhile, the temperatures at a plurality of points on the surface of the chuck top 36 are measured by the radiation thermometer 52 at an appropriate timing before placing the wafer W on the chuck top 36.

Figure 9A:
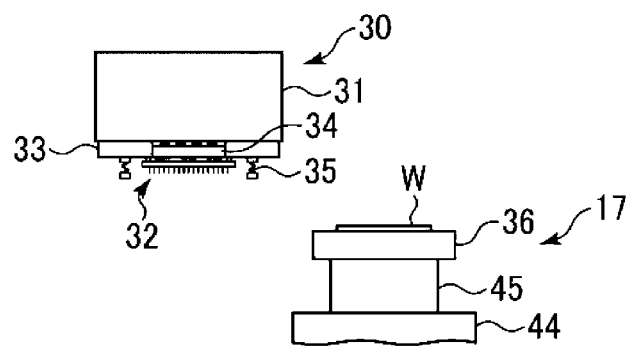
FIGS. 9A to 9D are views for explaining an operation of transferring a wafer onto a chuck top of an inspection unit having no wafer and bringing the wafer on the chuck top into contact with a probe card by an aligner to bring the wafer into an inspection state in the inspection system of FIG. 1.
Figure 9B:
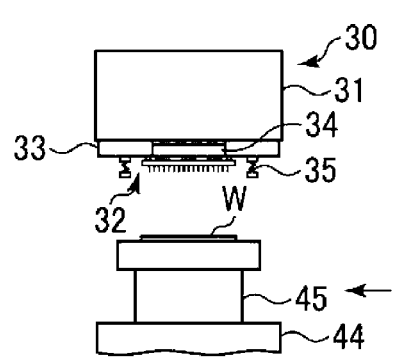
Figure 9C:
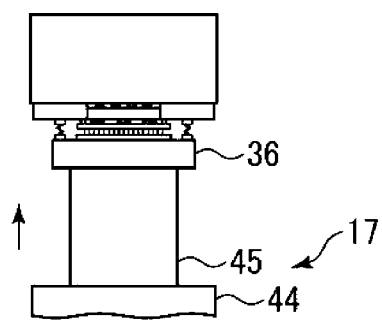

After the wafer W is placed on the chuck top 36, the aligner 17 is moved to photograph the lower surface of the probe card 32 by the lower camera 46, and a horizontal alignment of the chuck top 36 is performed by the aligner 17 (see, e.g., FIG. 9B).

In this state, the Z block 45 of the aligner 17 is lifted, and the wafer W on the chuck top 36 is brought into contact with the probe 32a of the probe card 32. Then, the lower portion of the bellows 35 and the upper surface of the chuck top 36 are brought into close contact with a seal ring (not illustrated), and the space surrounded by the bellows 35 is evacuated, whereby the chuck top 36 is adsorbed to the support plate 33. (see, e.g., FIG. 9C).

Figure 9D:
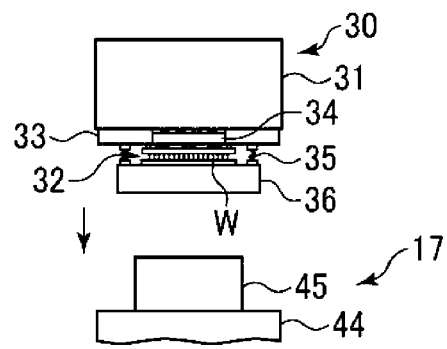

In this state, the electrical characteristics of the wafer W are inspected, and the Z block 45 of the aligner 17 is lowered (see, e.g., FIG. 9D). Then, the aligner 17 is moved to the inspection unit 30 that next transfers the wafer W.

Figure 10A:
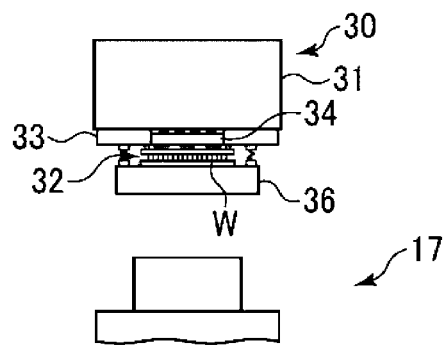
FIGS. 10A to 10D are views for explaining an operation of removing the chuck top and unloading the wafer on the chuck top in the inspection unit after the inspection is completed in the inspection system of FIG. 1.
Figure 10B:
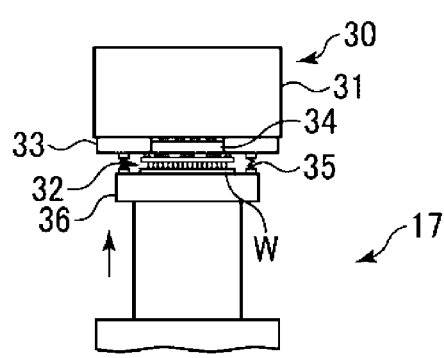
Figure 10C:
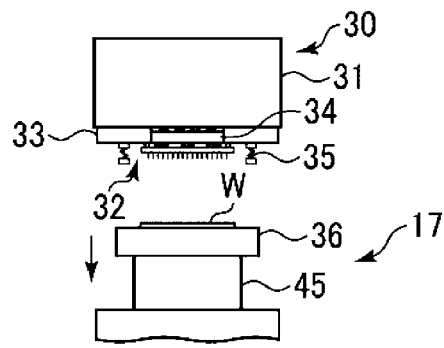

In the inspection unit 30 as a movement destination, the measurement of the electrical characteristics of the wafer W has been completed, and the aligner 17 is positioned at a position where the chuck top 36 adsorbed by the support plate 33 may be supported (see, e.g., FIG. 10A). Next, the Z block 45 of the aligner 17 is lifted, and the chuck top 36 is supported by the Z block 45 (see, e.g., FIG. 10B).

Figure 10D:
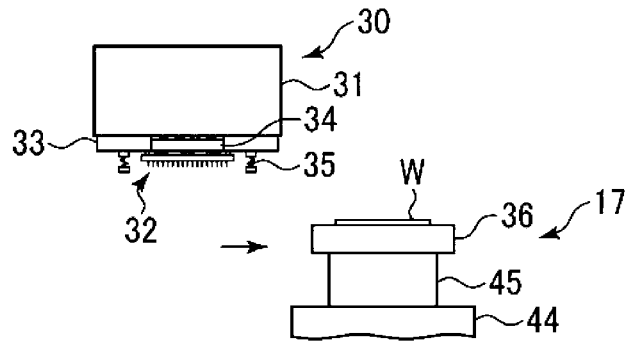

Next, the vacuum adsorption of the chuck top 36 is released, the chuck top 36 is lowered together with the Z block 45 (see, e.g., FIG. 10C), and the aligner 17 is moved to the transfer path 14 (see, e.g., FIG. 10D). The wafer W on the chuck top 36 is received by the transfer arm 15b of the transfer mechanism 15, and the transfer mechanism 15 is moved to the home position 23 and placed on the buffer unit 25. The wafer W is returned to the FOUP 18 by the loader 21 in the loader section 13.

The above operation is continuously performed, and the electrical characteristics of all the wafers W accommodated in the FOUP 18 are inspected.

According to the inspection system 10 of the present embodiment, since the loader section 13 is not provided opposite to the inspection section as in the related art, but is provided at one end part in the inspection unit arrangement direction, an empty space is reduced even when the number of inspection units 30 in the horizontal direction is increased.

Figure 11:
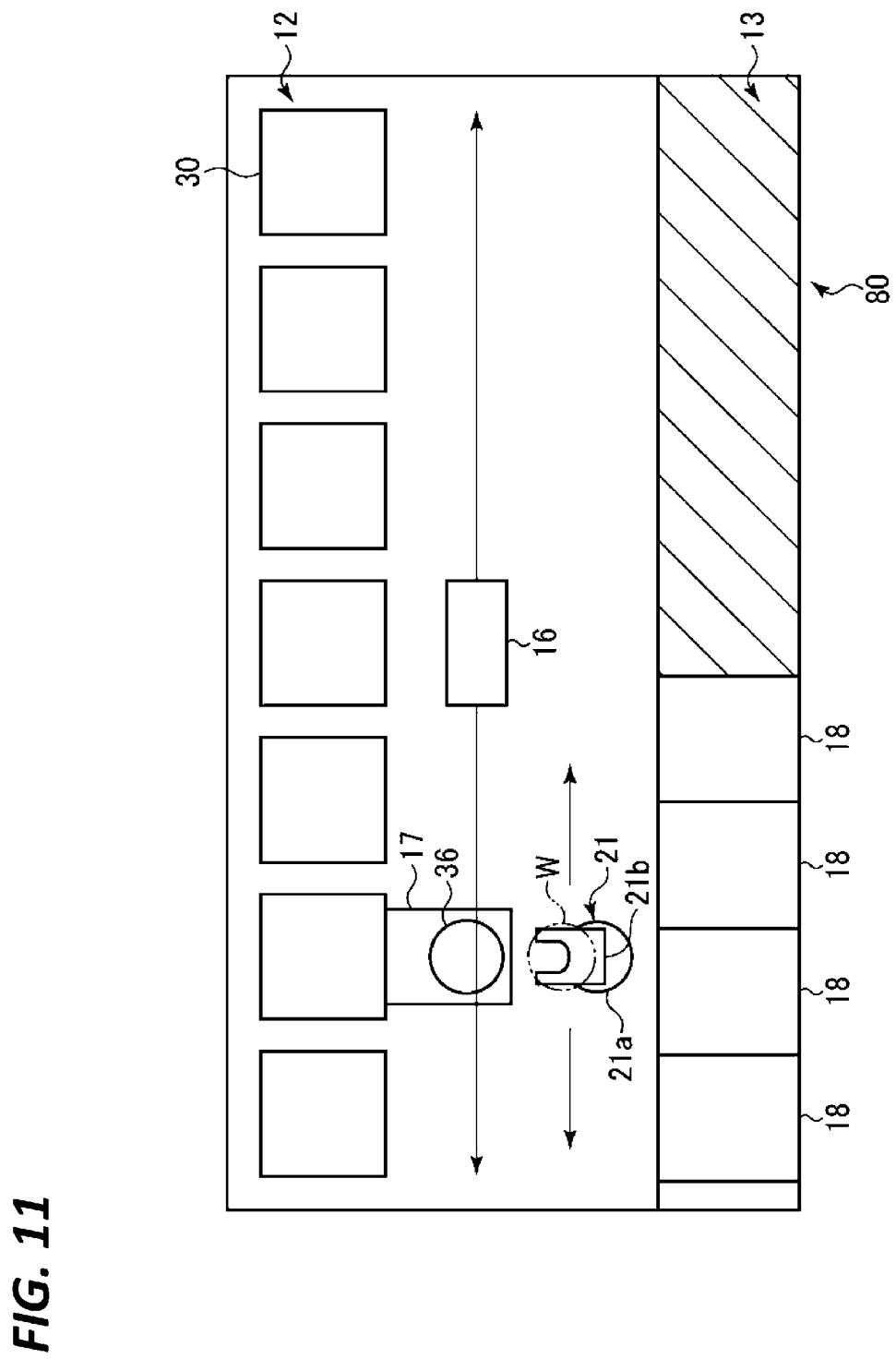
FIG. 11 is a plan view illustrating a schematic configuration of an inspection system of the related art.

In the related art, as illustrated in FIG. 11, the loader section 13 is provided to face the inspection section 12. For this reason, when the number of inspection units 30 in the horizontal direction is increased, in the loader section 13, in addition to the section corresponding to the number of necessary FOUPs 18, an empty space 80 that does not require the FOUPs 18 is generated. Therefore, even when the number of inspection units 30 is increased, the footprint per inspection unit 30 is hardly reduced. In the present embodiment, since the loader section 13 is provided at one end part of the inspection section 12 in the inspection unit arrangement direction, such an empty space is not generated. For this reason, the footprint per one inspection unit 30 may be made smaller than in the related art by increasing the number of inspection units 30 in the horizontal direction.

In addition, the footprint may be further reduced by making the transfer direction of the loader 21, that is, the arrangement direction of the FOUP 18 and the transfer direction of the transfer mechanism 15 orthogonal to each other.

Further, in the inspection system of the related art, since the wafer W is transferred by the loader 21 to all of the multi-tiered inspection units 30, it is necessary to secure a traveling space for the camera unit 16 and then form a transfer space for the loader 21 outside the space. In the present embodiment, since the transfer mechanism 15 is provided at each tier and the transfer mechanism 15 is configured to travel on the transfer path 14 which is a space where the camera unit 16 is arranged, the transfer space may be made smaller than in the related art. Thus, the footprint per inspection unit 30 may be further reduced. In addition, since the transfer space may be reduced in this way, a maintenance space may be provided on the back surface of the inspection unit 30.

Further, since the inspection units 30 are provided on both sides of the transfer path 14 in this way, the footprint per inspection unit 30 may be significantly reduced although the inspection system itself becomes larger than that of the related art.

In addition, since the camera unit 16 is provided with a radiation thermometer in addition to the camera 51, the temperature of the wafer on the chuck top 36 may be measured by a simple operation of transferring and aligning the black wafer BW. Also, since the alignment point at this time may be freely changed, the temperature distribution of the wafer may also be measured.

In the related art, the temperature of the wafer on the chuck top 36 is measured by installing a weight having a thermocouple attached to the surface of the chuck top 36 on the upper surface of the chuck top 36. However, since the operation is complicated and the inspection work takes time, it is required to shorten and automate the temperature measurement work. In addition, when performing an inspection at a low temperature, when the thermocouple is installed from the outside in this way to perform the temperature measurement, a dew point around the chuck top needs to be in a low temperature environment. For this reason, a waiting time for stabilizing the dew point after installing the thermocouple is required, and the temperature measurement work takes much longer.

Therefore, in the present embodiment, by a simple operation of providing a radiation thermometer 52 in the camera unit 16 and transferring and aligning the black wafer BW, the temperature and temperature distribution of the wafer on the chuck top may be measured online without performing the above-described complicated and time-consuming work.

Second Embodiment

Next, a second embodiment will be described.

Figure 12:
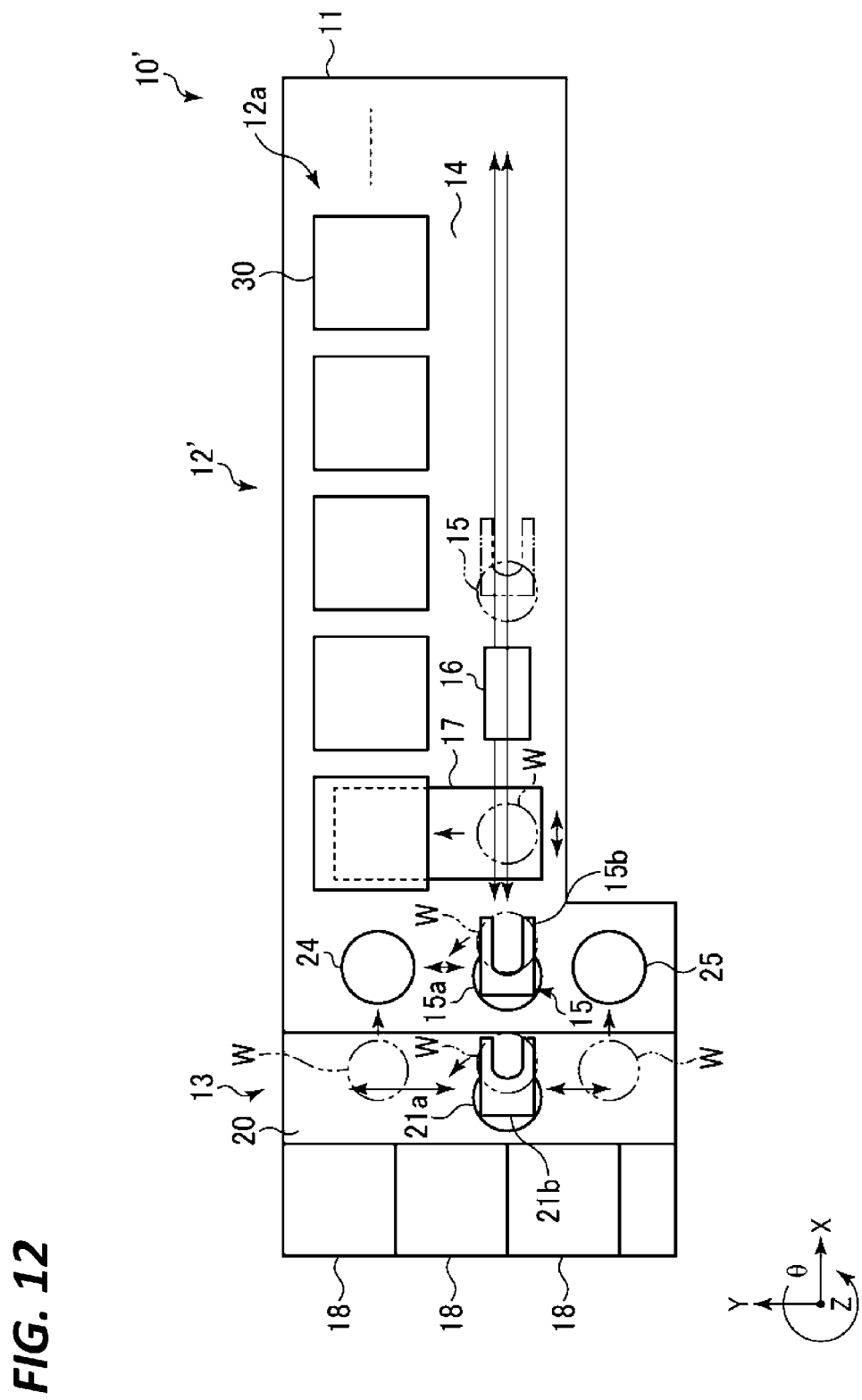
FIG. 12 is a plan view illustrating a schematic configuration of an inspection system according to a second embodiment.

FIG. 12 is a plan view illustrating an inspection system according to the second embodiment. Unlike the inspection system 10 of the first embodiment, an inspection system 10' of the present embodiment includes a first inspection part 12a and an inspection section 12' including only three transfer paths 14, and a second inspection part 12b does not exist in the inspection section 12'. As in that of the first embodiment, in the first inspection part 12a, inspection unit rows in which a plurality of (in the drawing, five or more) inspection units 30 are arranged along the X direction in the drawing are arranged in three tiers in the Z direction (vertical direction). Further, each transfer path 14 extends along the X direction to the side of each tier of the first inspection part 12a. Other configurations are the same as those of the inspection system 10 of the first embodiment.

In the inspection system 10' of the present embodiment, the loader section 13 is not provided opposite to the inspection section 12 as in the related art, but is provided at one end part of the inspection section 12 in the inspection unit arrangement direction. For this reason, the number of inspection units 30 is reduced as compared with the inspection system 10 of the first embodiment, but as in the first embodiment, even when the number of inspection units 30 in the horizontal direction is increased, the empty space may be reduced. Therefore, the inspection system 10' of the present embodiment may reduce the footprint per inspection unit 30 compared to that of the related art.

Also in the present embodiment, as in the first embodiment, since the transfer mechanism 15 is provided at each tier and the transfer mechanism 15 travels on the transfer path 14 which is a space where the camera unit 16 is arranged, the transfer space may be made smaller than in the related art. Thus, the footprint per inspection unit 30 may be further reduced. In addition, since the transfer space may be reduced in this way, a maintenance space may be provided on the back surface of the inspection unit 30.

Further, although the number of inspection units 30 is halved compared to the first embodiment, the inspection system itself is compact, and the burden on the transfer mechanism 15 may be reduced as compared with the first embodiment.

Third Embodiment

Next, a third embodiment will be described.

Figure 13:
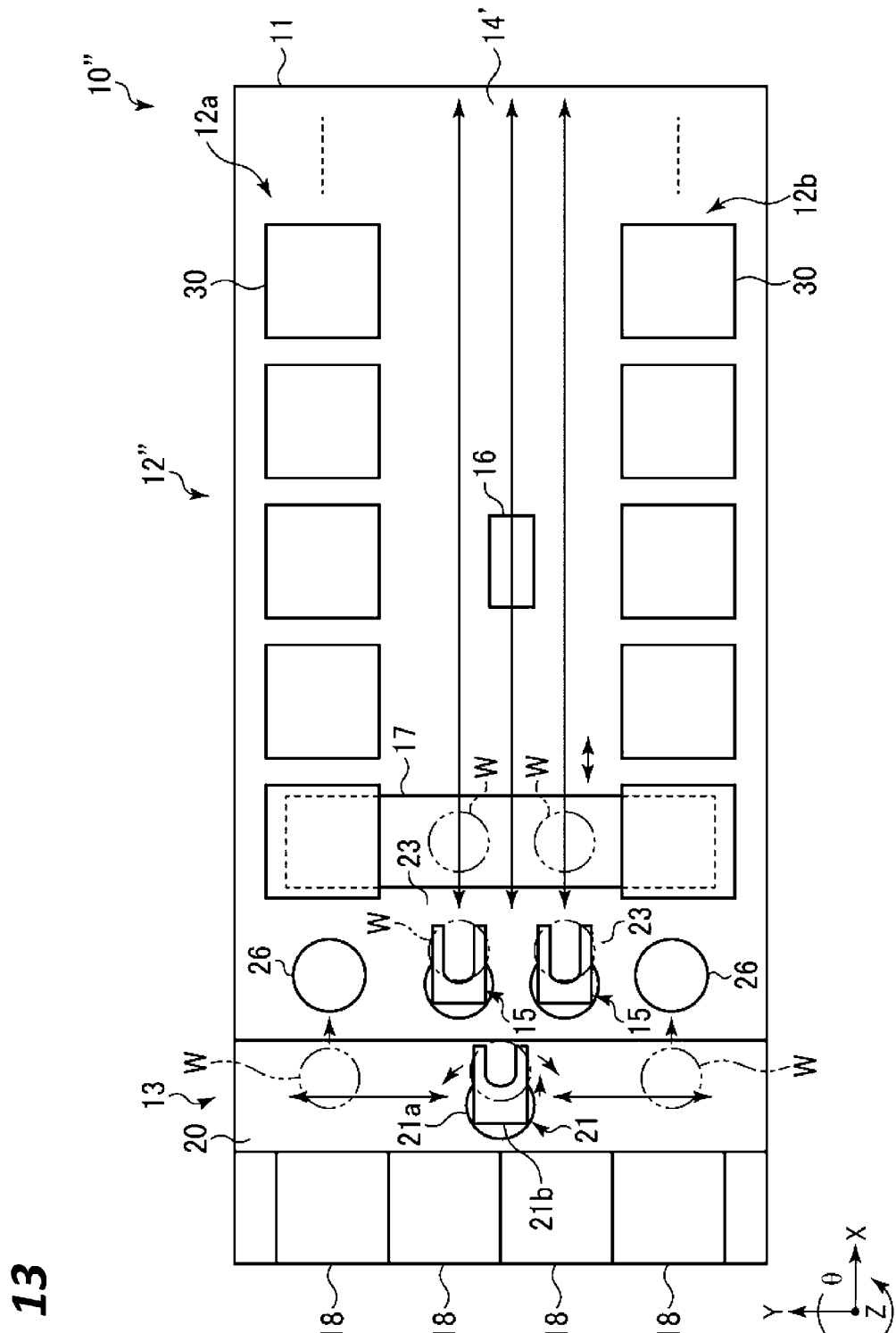
FIG. 13 is a plan view illustrating a schematic configuration of an inspection system according to a third embodiment.

FIG. 13 is a plan view illustrating an inspection system according to the third embodiment. Unlike the inspection system 10 of the first embodiment, the inspection system 10" of the present embodiment has an inspection section 12" provided with two transfer mechanisms 15 that move along the X direction on each tier of the transfer path 14' between the first inspection part 12a and the second inspection part 12b. One transfer mechanism 15 is dedicated to the first inspection part 12a, and the other transfer mechanism 15 is dedicated to the second inspection part 12b.

Further, a wafer placement unit 26 having both a pre-alignment unit and a buffer unit is provided on the side of the two transfer mechanisms 15 at the home positions 23 thereof. Other configurations are the same as those of the inspection system 10 of the first embodiment.

According to the inspection system 10" of the present embodiment, since the two transfer mechanisms 15 travel, the width of the transfer path 14' of each second tier becomes wider than that of the transfer path 14 of the first embodiment, and the footprint is increased accordingly, and the inspection system is increased in size. However, since one of the two transfer mechanisms 15 is dedicated to the inspection unit 30 of the first inspection part 12a and the other thereof is dedicated to the inspection unit 30 of the second inspection part 12b, the burden on the transfer mechanism 15 becomes lighter than that of the first embodiment, and the throughput of processing may be increased.

<Other Applications>

Although the embodiments have been described above, the embodiments disclosed this time need to be considered as illustrative in all points and not restrictive. The embodiments described above may be omitted, substituted, or changed in various forms without departing from the scope of the appended claims and the subject matter thereof.

For example, in the above-described embodiments, descriptions have been made on an example in which the aligner and the transfer mechanism are provided separately. However, the transfer stage may be configured with the chuck top mounted on the aligner, and the transfer stage may have both the function of the aligner and the function of the transfer mechanism.

Further, the aligner may be provided in each inspection unit, and the wafer may be transferred to and from the aligner of each inspection unit by a transfer mechanism.

In addition, in the above-described embodiments, descriptions have been made on an example in which the number of tiers in the height direction of the inspection unit is three. However, the number of tiers is not limited thereto, and may be an appropriate number of tiers according to the arrangement space of the inspection system.

DESCRIPTION OF SYMBOLS 10, 10', 10": inspection system
11: housing
12, 12', 12": inspection section
13: loader section
14, 14': transfer path
15: transfer mechanism
16: camera unit
17: aligner
18: FOUP
21: loader
30: inspection unit
70: controller
W: wafer (inspection target)

What is claimed is:

1. An inspection system comprising:
an inspection section provided with an inspection part having a plurality of inspection units each including a tester configured to perform an electrical inspection of an inspection target and a probe card provided between the tester and the inspection target; and
a loader section including an arrangement part in which a storage container for the inspection target is disposed, and a loader configured to deliver the inspection target between the storage container and the inspection section,
wherein the inspection part includes a plurality of inspection unit rows that are formed by arranging the plurality of inspection units in one horizontal direction and arranged in a plurality of tiers in a vertical direction,
the arrangement part is provided on an end part side of the inspection part in the one horizontal direction,
the inspection section is provided adjacent to each tier of the inspection unit rows of the inspection part, and further includes a plurality of transfer paths extending in the one horizontal direction and a plurality of transfer mechanisms each including a transfer arm provided to be movable along the transfer paths and configured to deliver the inspection target loaded from the loader to and from the inspection units, and
in the arrangement part of the loader section, a plurality of storage containers is arranged in a direction orthogonal to an arrangement direction of the inspection units.

2. The inspection system according to claim 1, wherein in the inspection section, the inspection units are provided in a plurality of tiers in a vertical direction on an opposite side of the inspection part across each of the transfer paths, and the inspection section further includes another inspection part in which the plurality of tiers of inspection units are arranged in the one horizontal direction.

3. The inspection system according to claim 2, wherein two transfer mechanisms are provided to be movable along each of the transfer paths, one of the transfer mechanisms performs a delivery of the inspection target on an inspection unit that belongs to one inspection part, and a remaining one of the transfer mechanisms performs a delivery of the inspection target on an inspection unit that belongs to another inspection part.

4. The inspection system according to claim 1, further comprising:
an aligner provided at each tier of the inspection unit rows of the inspection parts and positions the inspection target placed on a stage with respect to the probe card of an inspection unit.

5. The inspection system according to claim 4, wherein the aligner is provided to be accessible to all the inspection units at each tier in one or all of the two inspection parts.

6. The inspection system according to claim 4, wherein the inspection unit is configured such that the inspection target placed on the stage is adsorbed to the stage in a state of being in contact with a probe of the probe card, and
the aligner lifts the stage in one inspection unit to bring the inspection target into contact with the probe, moves the inspection target adsorbed to the stage from the one inspection unit to another inspection unit for which an inspection is completed, and separates the another stage from the inspection unit.

7. The inspection system according to claim 4, further comprising:
a camera unit provided to be movable along the transfer paths and including a camera for aligning the inspection target placed on the stage.

8. The inspection system according to claim 7, wherein the camera unit includes a radiation thermometer that measures a substrate temperature on the stage.

9. The inspection system according to claim 7, wherein the camera unit is provided to be movable in the transfer paths along the transfer mechanisms and a common guide rail.

10. An inspection system comprising:
two inspection parts having a plurality of inspection units each including a tester configured to perform an electrical inspection of an inspection target and a probe card provided between the tester and the inspection target, a plurality of inspection unit rows being formed by arranging the plurality of inspection units in one horizontal direction and arranged in a plurality of tiers in a vertical direction, and the inspection unit rows being provided at intervals to face each other;

a plurality of transfer paths formed between the inspection unit rows at each of the tiers in the two inspection parts and extending in the one horizontal direction; and a plurality of transfer mechanisms each including a transfer arm provided to be movable along each of the transfer paths and configured to deliver the inspection target between the inspection units of the inspection unit rows at each of the tiers, wherein the two inspection parts, the transfer paths, and the transfer mechanisms constitute an inspection section, the inspection system further comprises a loader section that includes an arrangement part in which a storage container for the inspection target is disposed, and a loader configured to deliver the inspection target between the storage container and the inspection section, the arrangement part is provided on end part sides of the two inspection parts in the one horizontal direction, and in the arrangement part of the loader section, the plurality of storage containers are arranged in a direction orthogonal to an arrangement direction of the inspection units.

11. The inspection system according to claim 10, wherein two transfer mechanisms are provide to be movable along each of the transfer paths, one of the transfer mechanisms performs a delivery of the inspection target on an inspection unit that belongs to one of the two inspection parts, and a remaining one of the transfer mechanisms performs a delivery of the inspection target on an inspection unit that belongs to a remaining one of the two inspection parts.

12. The inspection system according to claim 11, further comprising:
an aligner provided at each tier of the inspection unit rows of the inspection parts and positions the inspection target placed on a stage with respect to the probe card of an inspection unit.

13. The inspection system according to claim 12, wherein the aligner is provided to be accessible to all the inspection units at each tier in one or all of the two inspection parts.

14. The inspection system according to claim 13, wherein the inspection unit is configured such that the inspection target placed on the stage is adsorbed to the stage in a state of being in contact with a probe of the probe card, and
the aligner lifts the stage in one inspection unit to bring the inspection target into contact with the probe, moves the inspection target adsorbed to the stage from the one inspection unit to another inspection unit for which an inspection is completed, and separates the another stage from the inspection unit.

15. The inspection system according to claim 14, further comprising:
a camera unit provided to be movable along the transfer paths and including a camera for aligning the inspection target placed on the stage.

16. The inspection system according to claim 15, wherein the camera unit includes a radiation thermometer that measures a substrate temperature on the stage.

17. The inspection system according to claim 16, wherein the camera unit is provided to be movable in the transfer paths along the transfer mechanisms and a common guide rail.

* * * * *